United States Patent
Onaka et al.

(10) Patent No.: US 6,862,133 B2
(45) Date of Patent: Mar. 1, 2005

(54) RAMAN AMPLIFIER AND WAVELENGTH DIVISION MULTIPLEXING OPTICAL COMMUNICATION SYSTEM, AND METHOD OF CONTROLLING RAMAN AMPLIFICATION

(75) Inventors: Miki Onaka, Kawasaki (JP); Yasushi Sugaya, Kawasaki (JP); Etsuko Hayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 315 days.

(21) Appl. No.: 10/267,858

(22) Filed: Oct. 10, 2002

(65) Prior Publication Data

US 2003/0137720 A1 Jul. 24, 2003

(30) Foreign Application Priority Data

Jan. 18, 2002 (JP) ........................ 2002-010298

(51) Int. Cl.⁷ ............................................... H01S 3/00
(52) U.S. Cl. .................................. 359/334; 359/341.31
(58) Field of Search .......................... 359/334, 341.31; 372/3

(56) References Cited

U.S. PATENT DOCUMENTS

| | | | | |
|---|---|---|---|---|
| 6,115,174 | A | 9/2000 | Grubb et al. ............... | 359/334 |
| 6,441,950 | B1 * | 8/2002 | Chen et al. .................. | 359/334 |
| 6,452,715 | B1 * | 9/2002 | Friedrich ..................... | 359/334 |
| 6,452,716 | B1 * | 9/2002 | Park et al. ................... | 359/334 |
| 6,476,961 | B1 * | 11/2002 | Ye et al. ................ | 359/341.43 |
| 6,498,677 | B1 * | 12/2002 | Sun et al. ................. | 359/341.4 |
| 6,545,800 | B1 * | 4/2003 | Wilson et al. ........... | 359/341.4 |
| 6,556,345 | B1 * | 4/2003 | Gassner et al. .......... | 359/341.4 |
| 6,687,045 | B2 * | 2/2004 | Lelic ....................... | 359/337.1 |
| 6,687,049 | B1 * | 2/2004 | Sulhoff et al. ........... | 359/341.4 |
| 6,690,506 | B2 * | 2/2004 | Zahnley et al. .......... | 359/337.11 |
| 6,798,567 | B2 * | 9/2004 | Feldman et al. ........ | 359/341.42 |
| 2001/1046083 | | 11/2001 | Akasaka et al. ............. | 359/334 |
| 2002/0080447 | A1 * | 6/2002 | Fells et al. .................. | 359/141 |
| 2002/0094158 | A1 * | 7/2002 | Evans et al. .................. | 385/27 |
| 2003/0011855 | A1 * | 1/2003 | Fujiwara ..................... | 359/177 |
| 2003/0067670 | A1 * | 4/2003 | Pavel et al. ................. | 359/337 |
| 2003/0108351 | A1 * | 6/2003 | Feinberg et al. ............. | 398/34 |
| 2004/0019459 | A1 * | 1/2004 | Dietz et al. ................. | 702/184 |

FOREIGN PATENT DOCUMENTS

JP     2001-235772     8/2001     ............. G02F/1/35

OTHER PUBLICATIONS

EP Search Report for Corresponding EP Application dated Jun. 20, 2003, EP02023035.
Optical Fiber Communication Conference and Exhibit; Postdeadline Papers; Changing at light speed, Mar. 22, 2002, pp. PD3–1 to PD3–3, Hermelstein et al.

* cited by examiner

Primary Examiner—Thomas H. Tarcza
Assistant Examiner—Deandra M. Hughes
(74) Attorney, Agent, or Firm—Staas & Halsey LLP

(57) ABSTRACT

The present invention has an object to provide a Raman amplifier, a WDM optical communication system and a method of controlling the Raman amplification, capable of optimizing amplification characteristics in response to a change of operating conditions of the system so that transmission quality of the WDM signal light can be maintained in good. In order to achieve the above object, in the Raman amplifier according to the present invention, a plurality of pumping light generated by a pumping light generating section capable of varying a wavelength and power of the plurality of pumping light, are multiplexed by a pumping light multiplexing section that has wavelength variable transmission characteristics, and are supplied to an optical transmission path via a pumping light supplying section, and signal light being propagated through the optical transmission path is Raman amplified, wherein the Raman amplifier comprises a pumping light administrating section that controls supply conditions of the pumping light by adjusting operational setting of the pumping light generating section and the wavelength transmission characteristics of the pumping light multiplexing section in synchronization with the change with time of the system operational conditions.

11 Claims, 12 Drawing Sheets

RAMAN AMPLIFIER AND WAVELENGTH DIVISION MULTIPLEXING OPTICAL COMMUNICATION SYSTEM, AND METHOD OF CONTROLLING RAMAN AMPLIFICATION

BACKGROUND OF THE INVENTION

1. Field of the Invention

The present invention relates to a Raman amplifier that amplifies a wavelength division multiplexed (WDM) signal by utilizing a Raman effect, a WDM optical communication system, and a method for controlling Raman amplification, and in particular, relates to technology for controlling pumping light in order to realize the Raman amplification coping with variations in system operating conditions.

2. Description of the Related Art

A WDM optical communication method that multiplexes optical signals having different wavelengths to transmit them in a single optical fiber is an effective means for realizing a more economical optical communication system of larger capacity as well as a flexible optical network. Particularly, as technology with regard to optical amplifiers has been developed in recent years, the WDM optical communication method becomes in practical use rapidly as backbone technology supporting the Internet service.

The WDM optical communication system enables long-distance transmission mainly by repeating signal light while amplifying it in a repeater stage using optical amplification repeating technology. As an optical amplifying means in such a WDM optical communication system, there are used a rare-earth element doped optical fiber amplifier, a Raman amplifier, and so on.

With regard to the Raman amplifier mentioned above, two amplification types are known: that is, a distributed parameter type and a concentrated type. The distributed parameter type is an amplification type in that pumping light is introduced into a transmission path (for example, a silica-based optical fiber and the like) of an optical communication system, to Raman amplify in a distributing manner signal light being propagated through the transmission path, so that a part of loss that occurs when the signal light passes through the transmission path can be compensated. On the other hand, the concentrated type is an amplification type in that the pumping light is introduced in a concentrated manner into an optical fiber having a small effective cross-sectional area, for example, and high non-linearity for Raman amplification.

The Raman amplification of both of the distributed parameter type and the concentrated type described above shows amplification characteristics having a gain peak at a frequency lower than the frequency of the pumping light by a Raman shift amount (for example, 13.2 THz in the case of silica-based medium). Therefore, it is possible to amplify signal light of an arbitrary wavelength by preparing a pumping light source of an appropriate pumping light wavelength in consideration of the shift frequency of the Raman gain, and it is also possible to Raman amplify WDM signal light having wider bandwidth arbitrarily by combining a plurality of pumping light of different wavelengths. Further, by changing a distribution ratio of pumping light power of each of the wavelengths, a profile of the Raman gain corresponding to each pumping light wavelength may also be changed so that wavelength dependence of the Raman amplified WDM signal light can be adjusted arbitrarily.

By the way, in the optical network system of next generation, for example, it is anticipated that operating conditions of the system such as a wavelength band of the WDM signal light and the number of signal light, a signal light level input to an optical transmission path, a type of the optical transmission path and the like may be changed dynamically. However, in the previously proposed technology regarding the Raman amplification, there is a problem in that it is difficult to flexibly cope with the dynamic change of the system operating conditions described above.

More specifically, for example, if the operating conditions are changed such that so-called S-band (a wavelength band of 1480 nm–1520 nm) is added to WDM signal light using C-band (a wavelength band of 1525 nm–1565 nm) and L-band (a wavelength band of 1570 nm–1620 nm), since most of the conventional Raman amplifiers have been designed individually corresponding to each band, it is possible to cope with a change of operating wavelength in one band by controlling the power, wavelength and the like of the pumping light, but it is difficult to cope with such a dynamic change across a plurality of bands using a single type of Raman amplifier.

Further, when the signal light of S-band is added as described above in order to achieve the wider bandwidth of WDM signal light, there is a possibility that a wavelength of pumping light used before the change of the operating conditions may coincide with or considerably approximate to a wavelength of the added S-band signal light, resulting in a problem in degradation of transmission quality of the WDM signal light.

Still further, it is anticipated that the dynamic change of the operating conditions described above is practically carried out in stepwise along with the lapse of required time. In such a case, it is important to cope with the change of the operating conditions without affecting the service in operation. Therefore, it is necessary to establish controlling technology for optimizing a gain and gain wavelength characteristics of the Raman amplification in response to the change with time of the operating conditions.

SUMMARY OF THE INVENTION

The present invention has been achieved in view of the above problems and has an object to provide a Raman amplifier, a WDM optical communication system and a method of controlling the Raman amplification, capable of optimizing amplification characteristics in response to a change of system operating conditions so that transmission quality of WDM signal light can be maintained in good conditions.

In order to achieve the above object, the present invention provides a Raman amplifier supplying pumping light to an amplification medium on an optical transmission path through which signal light is propagated and Raman amplifying the signal light being propagated through the amplification medium, comprising: a pumping light supplying unit that generates a plurality of pumping light capable of changing at least one of a wavelength and power thereof, and multiplexes the plurality of pumping light to supply the multiplexed pumping light to the amplification medium; and a pumping light controlling unit that controls supply conditions of the pumping light by the pumping light supplying unit in synchronization with a change with time of operating conditions based on information indicating the operating conditions with regard to transmission of signal light.

According to such a Raman amplifier as described above, the wavelength or the power or both of them of the plurality of pumping light supplied to the amplification medium by the pumping light supplying unit is controlled by the pumping light controlling unit in synchronization with the change with time of the operating conditions. Therefore, even when the operating conditions with regard to the transmission of signal light such as, for example, a wavelength band to be operated and the number of signal light are changed dynamically, since supply conditions of pumping light are adjusted in response to the change with time, it is possible to cope with, only by a single type of the Raman amplifier, the change of the operating conditions flexibly. Further, since the supply conditions of pumping light can also be optimized in response to the change of the operating conditions, power consumption of the Raman amplifier can be reduced.

The pumping light controlling unit of the Raman amplifier calculates a target value of the supply conditions of pumping light after the change of the operating conditions based on the information indicating the operating conditions with regard to the transmission of signal light, and sets priority of the control to the plurality of pumping light corresponding to the change with time of the operating conditions. Then, in accordance with a changing procedure determined according to the priority, the pumping light supplying unit may be controlled so that the supply conditions of pumping light can approach the target value in synchronization with the change with time of the operating conditions. By controlling the supply conditions of pumping light, it becomes possible to cope with the change of the operating conditions without affecting the service in operation.

Further, with regard to the priority that is set by the pumping light controlling unit described above, when the wavelength of pumping light before the change of the operating conditions coincides with or approaches the wavelength of the signal light after the change of the operating conditions, it is preferable that higher priority is set to the control to that pumping light than other pumping light. Thus, since the pumping light having a wavelength that coincides with or approaches a wavelength of the signal light after the change of the operating conditions is controlled with priority, conditions wherein Rayleigh scattered light and the like of the pumping light interferes with the signal light to cause noise can be avoided.

In a WDM optical communication system according to the present invention, the Raman amplifier of the present invention is applied to each system that Raman amplifies and transmits WDM signal light including a plurality of channel light having different wavelengths. According to such a WDM optical communication system, it is possible to keep transmission quality of the transmitted WDM signal light in good conditions even when the operating conditions of the system are changed.

According to the present invention, there is provided a controlling method for when pumping light is supplied to an amplification medium on an optical transmission path through which signal light is propagated and the signal light being propagated through the amplification medium is Raman amplified, wherein: in a condition where a plurality of pumping light capable of changing at least one of a wavelength and power thereof are generated and the plurality of pumping light are multiplied to be supplied to the amplification medium, this condition of supplying the pumping light is controlled in synchronization with a change with time of operating conditions based on information indicating the operating conditions with regard to transmission of signal light.

The other objects, features and advantages of the present invention will be apparent from the following description of the embodiment with reference to the accompanying drawings.

DETAILED DESCRIPTION OF THE INVENTION

Hereinafter, embodiments of the present invention will be described with reference to drawings.

Figure 1:
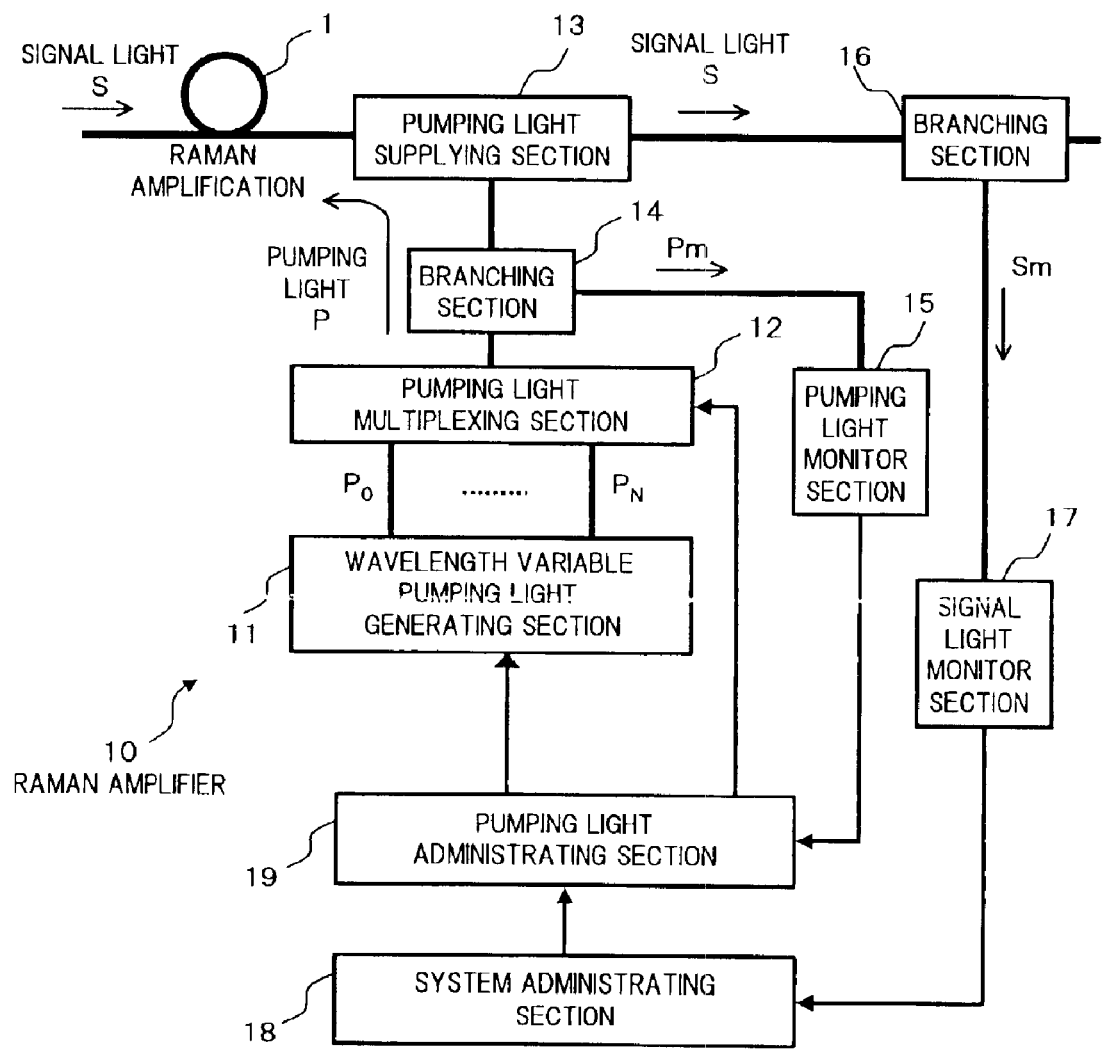
FIG. 1 is a functional block diagram showing a basic configuration of a Raman amplifier according to the present invention.

FIG. 1 is a functional block diagram showing a basic configuration of a Raman amplifier according to the present invention.

A Raman amplifier 10 as shown in FIG. 1 comprises, for example, a wavelength variable pumping light generating section 11, a pumping light multiplexing section 12 and a pumping light supplying section 13 that are for supplying pumping light P to an optical transmission path 1 as an optical amplification medium, a branching section 14 and a pumping light monitor section 15 that are for monitoring supply conditions of the pumping light P, a branching section 16 and a signal light monitor section 17 that are for monitoring WDM signal light S propagated through the optical transmission path 1 to be Raman amplified, a system administrating section 18 that generates and administrates information about transmission quality of the WDM signal light (hereinafter referred to as the "transmission quality information") and information about operating conditions of a system to which the Raman amplifier 10 is connected (hereinafter referred to as the "system operating information") based on a monitoring result of the signal light monitor section 17, and a pumping light administrating section 19 that controls operations of the wavelength variable pumping light generating section 11 and the pumping light multiplexing section 12 in response to the monitoring result of the signal light monitor section 17 and the administrating information of the system administrating section 18.

The wavelength variable pumping light generating section 11 can generate a plurality of pumping light $P_0$–$P_N$ (N is an integer) of different wavelengths and can change the wavelengths $\lambda_0$–$\lambda_N$ and power of each pumping light. A specific example of the wavelength variable pumping light generating section 11 will be described later.

The pumping light multiplexing section 12 wavelength division multiplexes and outputs each pumping light $P_1$–$P_N$ generated by the wavelength variable pumping light generating section 11. It is assumed here that the pumping light multiplexing section 12 can change multiplexing characteristics (wavelength transmission characteristics). A specific example of the pumping light multiplexing section 12 will also be described later.

The pumping light supplying section 13 is to supply the pumping light P that has been output from the pumping light multiplexing section 12 and has passed through the branching section 14, to the optical transmission path 1 (the amplification medium). Here, it supplies the pumping light P to the optical transmission path 1 so that the propagation direction of the pumping light P is opposite to a propagation direction of the WDM signal light S. Further, the pumping light supplying section 13 passes therethrough the WDM signal light S that has been propagated through the optical transmission path 1 and Raman amplified, to transmits it to an optical path at the output side. As a specific example of the pumping light supplying section 13, a WDM coupler, an optical circulator and the like can be used.

The branching section 14 branches a part of the pumping light P output from the pumping light multiplexing section 12 as monitoring light Pm, to output it to the pumping light monitor section 15. The pumping light monitor section 15 monitors power and a spectrum of the pumping light P based on the monitoring light Pm from the branching section 14 to notify the pumping light administrating section 19 of the monitoring result.

The branching section 16 branches a part of the WDM signal light S that has passed through the pumping light supplying section 13 as a monitoring light Sm, to output it to the signal light monitor section 17. The signal light monitor section 17 monitors output conditions of the Raman amplified WDM signal light S based on the monitoring light Sm from the branching section 16 to notify the system administrating section 18 of the monitoring result. Further, the signal light monitor section 17 detects a supervisory signal included in the WDM signal S using the monitoring light Sm from the branching section 16.

The system administrating section 18 generates transmission quality information based on an optical SN ratio, an output level and the like monitored by the signal light monitor section 17 and also generates system operating information based on the supervisory signal detected by the signal light monitor section 17, to send each information to the pumping light administrating section 19. Here, a specific example of the transmission quality information may include, for example, an optical SN ratio, inter-channel deviation, an optical power level and the like of the Raman amplified WDM signal light S. On the other hand, a specific example of the system operating information may include, for example, a wavelength band and the number of signal light of the WDM signal light S, a signal light input level to the optical transmission path, a type of the optical transmission path and the like. Further, it is assumed that the system operating information described above includes more detailed information corresponding to a change with time of the operating conditions, as described later.

In response to the transmission quality information and the system operating information from the system administrating section 18, the pumping light administrating section 19 calculates optimal supply conditions of the pumping light for realizing the Raman amplification capable of coping with the change of the operating conditions without affecting service in operation. Then, by setting the calculated value as a target value (an initial value), the pumping light administrating section 19 controls, respectively, the wavelength and power of the pumping light generated in the wavelength variable pumping light generating section 11, and the wavelength transmission characteristics of the pumping light multiplexing section 12. Further, based on the monitoring result from the pumping light monitor section 15, the pumping light administrating section 19 executes a feedback control of the wavelength variable pumping light generating section 11 and the pumping light multiplexing section 12 so that the pumping light P to be actually supplied coincides with the target value mentioned above.

Next, the operation of the Raman amplifier 10 described above will be described.

In the Raman amplifier 10, basically, the pumping light P, the wavelength and power of which are controlled by the pumping light administrating section 19, is supplied to the optical transmission path 1 by the pumping light supplying section 13 and is propagated through the optical transmission path 1 in a direction opposite to the WDM signal light S. Then, by means of Raman effect of the pumping light P, the WDM signal light S being propagated through the optical transmission path 1 is amplified to a required level, and the Raman amplified WDM signal light S passes through the pumping light supplying section 13 to be sent to the optical path at the output side. By using low frequency intensity modulation or by using a channel other than the signal light channel and so on, the supervisory signal is superimposed on the WDM signal light S. Herein, the supervisory signal is detected by the signal light monitor section 17 via the branching section 16, and transmitted to the system administrating section 18. Based on the detected supervisory signal, the system administrating section 18 judges the operating conditions such as the wavelength band of the WDM signal light S as described above to generate the system operating information.

Figure 2:
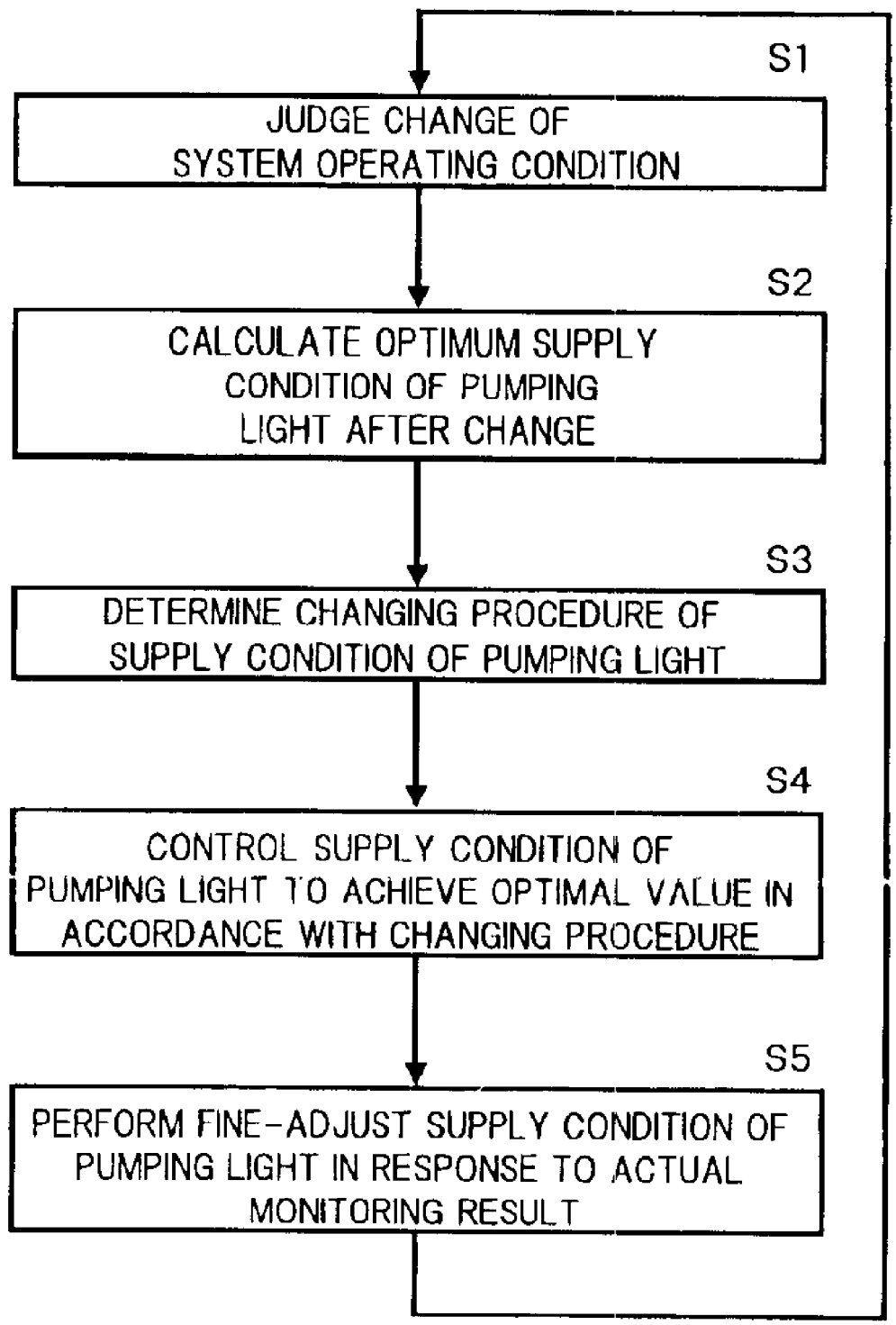
FIG. 2 is a flow chart showing a basic procedure for optimizing supply conditions of pumping light in the Raman amplifier according to the present invention.

Then, when the change of the system operating conditions is judged in the system administrating section 18, in response to this change, the supply conditions of the pumping light P is optimized in accordance with a basic procedure as shown in the flow chart of FIG. 2.

First, in Step 1 (designated as S1 and following steps are designated similarly in the figure) of FIG. 2, when the system operating information indicating the change of the operating conditions is transmitted from the system administrating section 18 to the pumping light administrating section 19, in Step 2, the pumping light administrating section 19 calculates the optimal supply conditions of the pumping light P after the change of the operating conditions. In this calculation of the optimal supply conditions, the optimal value of the wavelength and power of the pumping light P that copes with the system operating conditions after the change is obtained, for example, by referring to a database registered in advance in the pumping light administrating section 19.

Further, in Step 3, the pumping light administrating section 19 judges a transit method from the supply conditions of the pumping light P before the change of the operating conditions to the supply conditions of the pumping light P after the change calculated in Step 2, and then determines a changing procedure of the wavelength and power of the pumping light P capable of maintaining required transmission quality without affecting the service in operation.

Then, in Step 4, according to the changing procedure determined in Step 3, the pumping light administrating section 19, in synchronization with the change with time of the operating conditions, controls the operation of the wavelength variable pumping light generating section 11 and the wavelength transmission characteristics of the pumping light multiplexing section 12 until the supply conditions of the pumping light P achieve the optimal value calculated in Step 2.

Further, in Step 5, in response to the monitoring result of the pumping light monitoring section, the feedback control of the wavelength variable pumping light generating section 11 and the pumping light multiplexing section 12 is performed so that the conditions of the pumping light P being supplied actually coincides with the target value. Still further, concurrently with this, in response to the transmission quality information generated in the system administrating section 18 based on the monitoring result of the signal light monitor section 17, the supply conditions of the pumping light P are finely adjusted so that the transmission quality of the WDM signal light S actually Raman amplified is kept in good.

Here, the changing procedure of supply conditions of the pumping light P to be determined in Step 3 will be described in detail.

In the changing procedure of supply conditions of the pumping light P, it is preferable to judge, as a first step, a changing method from wavelength setting of the pumping light P before the change to wavelength setting of the pumping light P after the change, and then, to determine, as a second step, the changing procedure of the wavelength and power of the pumping light P in consideration of maintenance of the transmission quality of each channel light in operation.

In the first step, for example, it is desirable to obtain a difference between each pumping wavelength before the change and each pumping wavelength after the change calculated as the optimal value, and then to change setting of the optical source wavelength by corresponding to the pumping wavelength of a small difference. However, if the obtained difference exceeds the wavelength variable band of the pumping light source, a new pumping light source should be activated.

In the second step, basically, it is assumed that a procedure for adjusting operations of the wavelength variable pumping light generating section 11 and the pumping light multiplexing section 12 will be determined so that the wavelength and power of each pumping light $P_1$–$P_N$ can be adjusted concurrently in synchronization with the change with time of the system operating conditions. Also, when the changing procedure is determined, it is desirable to set priority of the adjustment to each pumping light $P_1$–$P_N$ so that pumping light that less affects the transmission quality has lower adjustment priority.

As conditions in which given pumping light has higher priority, it can be considered, for example, when the wavelength of the pumping light before the change of the operating conditions coincides with or approaches the wavelength of signal light after the change, control priority to the pumping light is set to be higher so that the wavelength of the pumping light can be shifted before the start of the operation of the above signal light. Further, it can also be considered, for example, priority to pumping light responsible for Raman gain of a particular signal light band that is in the course of change of its operating conditions is set to be higher than that to other pumping light so as to cope with the change of the operating conditions more reliably.

In order to perform adjustment of the pumping light in accordance with such priority, for example, information about the priority setting and an anticipated adjustment method are compiled into a database in advance so that the changing procedure of operational setting of the wavelength variable pumping light generating section 11 and the pumping light multiplexing section 12 can be determined based on this information. As the anticipated adjustment method mentioned above, it is contemplated that, when a wavelength of given pumping light is shifted, since the Raman gain of a wavelength band for which the pumping light of the wavelength before shifting has been responsible is reduced, the adjustment is performed so that power of pumping light having a wavelength nearer to the wavelength before the shift may be increased. Further, for example, when power of pumping light having a particular wavelength is increased, power of pumping light having a wavelength nearer to the particular wavelength may alternatively be reduced.

Here, optimization of the wavelength and power of the pumping light P in accordance with the changing procedure determined as described above will be described in more detail with reference to specific examples.

First, as a first specific example, a case is considered in which the operating conditions of the system to which the Raman amplifier 10 is applied are changed from setting to use C-band and L-band as the wavelength band of the WDM signal light S to setting to use S-band, C-band and L-band by adding the S-band.

In this case, for example, information about the change of specific system operating conditions as shown in (a)–(d) below is transmitted from the system administrating section 18 to the pumping light administrating section 19 (Step 1 in FIG. 2):

(a) a wavelength band of the added signal light: 1490 nm–1525 nm;
(b) the number of channels of the added signal light: 44 channels;
(c) optical power per one channel of the added signal light: 8 dBm/ch; and
(d) adding method: add the signal light from the short wavelength side on a one-by-one channel basis every "t" seconds after the addition starting time $T_0$.

In response to such system operating information, the pumping light administrating section 19, based on the information as shown in the above (a)–(d), calculates the optimal supply conditions of the pumping light P at the time of completion of the addition of the S-band as shown below, for example (Step 2 in FIG. 2):
the number of the wavelengths of the pumping light: 4;
the wavelength of each pumping light: 1395 nm, 1425 nm, 1455 nm and 1458 nm; and
the power of each pumping light supplied to the optical transmission path: 24 dBm, 22 dBm, 20 dBm and 18 dBm.

When the optimal wavelength and the target value of the power of the pumping light P described above are calculated, the pumping light administrating section 19 first judges the changing method from the wavelength setting of the pumping light P before the addition to the wavelength setting of the pumping light P after the addition, and then, determines the changing procedure of the pumping light P in consideration of the maintenance of the transmission quality (Step 3 in FIG. 2).

Here, assuming that the wavelength of the pumping light corresponding to the C-band and the L-band before the addition is set to three wavelengths consisting of 1430 nm, 1458 nm and 1490 nm, for example, the wavelength of the signal light of the added S-band coincides with the 1490 nm wavelength of the pumping light before the addition. It is desirable to avoid such circumstance on a top-priority basis, since Rayleigh scattered light of the backward pumping light (that is propagated in the direction same as the signal light) may interfere with the S-band signal light to cause noise. Therefore, control priority may be set to the 1490 nm pumping light is set to be higher so that it can be shifted to other wavelength. Then, for adjusting the pumping light having the next priority, it is preferable to activate new pumping light that is mainly responsible for the Raman gain for the added S-band. The method for changing the wavelength setting of the pumping light P before and after the addition and an example of the changing procedure in accordance with the priority as described above are shown in Table 1 below.

TABLE 1

| wavelength of pumping light before addition | method for changing to pumping light wavelength after addition | Priority |
| --- | --- | --- |
|  | new activation of 1395 nm ($\lambda_0$) pumping light | (2) |
| 1430 nm ($\lambda_1$) | wavelength shift from 1430 nm ($\lambda_1$) to 1425 nm ($\lambda_1'$) | (3) |
| 1458 nm ($\lambda_2$) | wavelength shift from 1458 nm ($\lambda_2$) to 1455 nm ($\lambda_2'$) | (4) |
| 1490 nm ($\lambda_3$) | wavelength shift from 1490 nm ($\lambda_3$) to 1485 nm ($\lambda_3'$) | (1) |

When the changing procedure of the pumping light P is determined as shown in Table 1, in accordance with the changing procedure, the wavelength variable pumping light generating section 11 and the pumping light multiplexing section 12 are controlled in compliance with the adding method shown in (d) above and in synchronization with time until the wavelength and power of the pumping light P achieve the target value calculated in Step 2 (Step 4 in FIG. 2).

Figure 3:
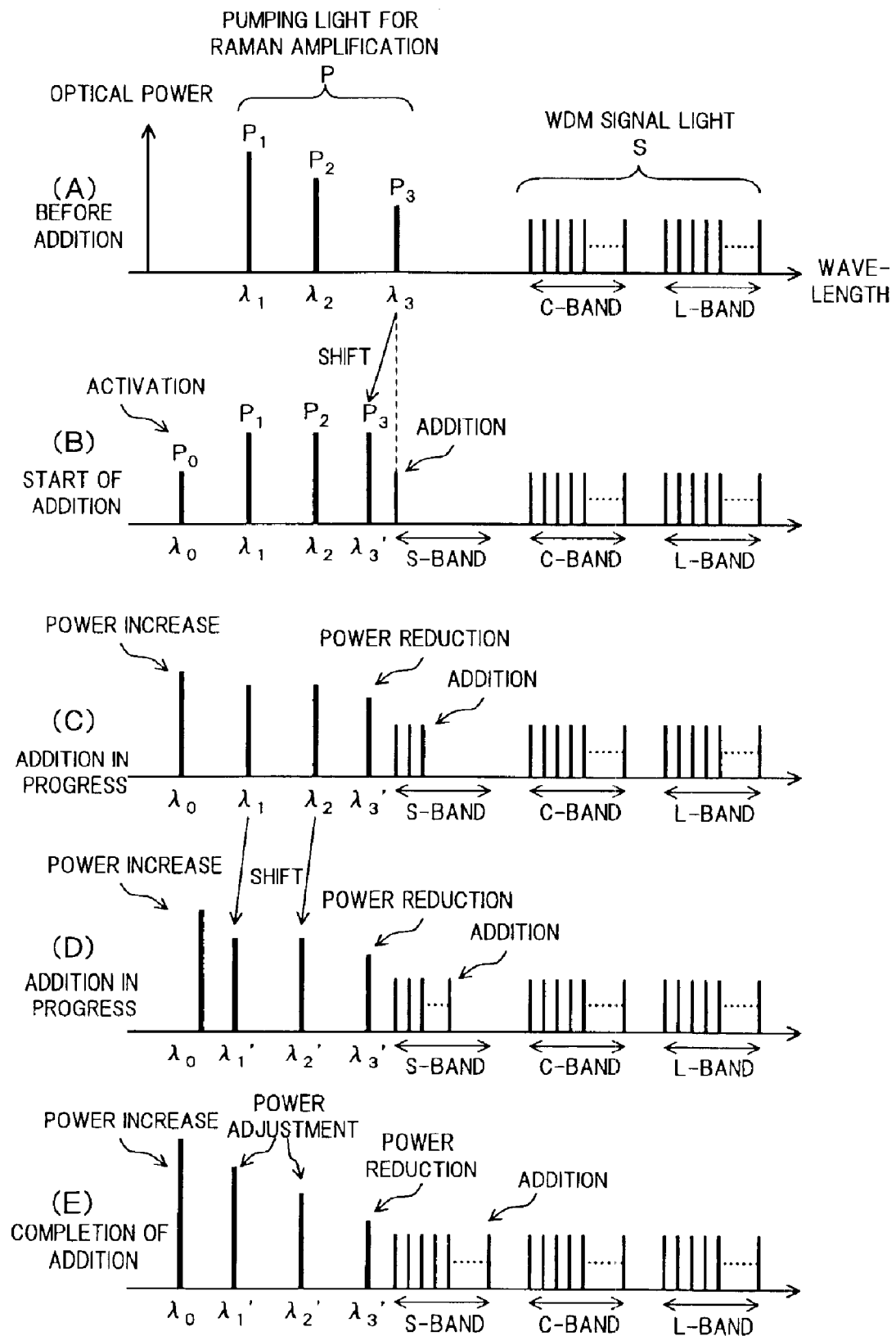
FIG. 3 is a diagram for explaining a controlling operation when S-band is added to the Raman amplifier according to the present invention.

FIG. 3 is a diagram for explaining a series of controlling operation in Step 4.

Before the S-band is added, as shown in (A) of FIG. 3, the pumping light P1, P2 and P3 having the wavelengths $\lambda_1$, $\lambda_2$ and $\lambda_3$ corresponding to the WDM signal light S of the C-band and the L-band are supplied to the optical transmission path 1 and each channel light included in the WDM signal light S is Raman amplified.

Then, at the time $T_0$ to start the addition, as shown in (B) of FIG. 3, signal light having the shortest wavelength in the S-band is added. At this time, the wavelength of the pumping light $P_3$ that coincides with the wavelength of the added signal light is shifted from $\lambda_3$ (1490 nm) to $\lambda_3'$ (1485 nm). Further, at the same time, pumping light $P_0$ having a wavelength of $\lambda_0$ (1395 nm) responsible for the Raman gain for the S-band is newly activated. The power of the pumping light $P_0$ which corresponds to the number of signals in the S-band, is set to a relatively small value at this stage. Further, in response to the wavelength shift of the pumping light $P_3$ and the activation of the pumping light $P_0$, the power of each pumping light $P_1$ and $P_2$ is adjusted so that required Raman gain for the C-band and the L-band can be obtained. Here, it is to be noted that the wavelength shift of the pumping light $P_3$, the activation of the pumping light $P_0$ and the power adjustment of each pumping light $P_0$–$P_3$ are performed by controlling the operation setting of the wavelength variable pumping light generating section 11 and the wavelength transmission characteristics of the pumping light multiplexing section 12 concurrently.

After the time $T_0$ to start the addition has elapsed, the signal light is added from the short wavelength side in sequence every "t" seconds, and at a stage where the addition is in progress as shown in (C) of FIG. 3, for example, the three of the signal light in the S-band are operated together with each signal light in the C-band and the L-band. In response to the increase of the number of signal light in the S-band, the supply conditions of the pumping light $P_0$ are controlled so that the power of the pumping light $P_0$ at the shorter wavelength side is increased and the power of the pumping light $P_3$ at the longer wavelength side is somewhat reduced.

As the addition of the S-band further proceeds and a large number of signal light is added in the S-band, the wavelength of the pumping light $P_1$ is shifted from $\lambda_1$ (1430 nm) to $\lambda_1'$ (1425 nm) and also the wavelength of the pumping light $P_2$ is shifted from $\lambda_2$ (1458 nm) to $\lambda_2'$ (1455 nm). Also at this time, in response to the increase of the number of signal light in the S-band, the operation of the wavelength variable pumping light generating section 11 is controlled so that the power of the pumping light $P_0$ is increased and the power of the pumping light $P_3$ at the longer wavelength side is somewhat reduced.

Then, at the stage where the addition of all of the signal light in the S-band is completed, as shown in (E) of FIG. 3, the wavelength and power of each pumping light $P_0$–$P_3$ are controlled to be the target value calculated in Step 2.

Here, the actual supply conditions of each pumping light $P_0$–$P_3$ are monitored by the pumping light monitor section 15 and, according to the monitoring result, the feedback control of the wavelength variable pumping light generating section 11 and the pumping light multiplexing section 12 is performed. Further, at the same time, the conditions of the WDM signal light S actually Raman amplified are monitored by the signal light monitor section 17, and according to the monitoring result, the supply conditions of each pumping light $P_0$–$P_3$ are finely adjusted so that the transmission quality can be kept in good (Step 5 in FIG. 2).

As described above, in the Raman amplifier 10, when the system operating conditions are changed dynamically due to the addition of the S-band, since the supply conditions of the pumping light P are optimized according to the change with time of the operating conditions, it is possible to add the S-band without affecting the service in operation. Especially, the wavelength of the pumping light $P_3$ that coincides with the wavelength of the added signal light is shifted on a top-priority basis, so that the circumstance in which Rayleigh scattered light and so on of the pumping light interferes with the signal light to cause noise can be avoided. Further, the pumping light $P_0$ responsible for the S-band is activated on a priority basis, so as to cope with the addition of the S-band more reliably. Thereby, it becomes possible to flexibly cope with the WDM signal light S that is operated over a wide wavelength band by a single type of the Raman amplifier 10, without need for preparing the Raman amplifiers corresponding to each band individually as in the conventional technique.

Here, in the first specific example, although the case in which the new band is added for the signal light has been shown, the present invention is not limited to this and can also be applied to the case in which new signal light is added within the band being in operation, similarly to the above case basically.

Next, as a second specific example of the optimization of the wavelength and power of the pumping light P, a case is considered in which the operating conditions of the system to which the Raman amplifier 10 is applied are changed so that the number of wavelength division multiplexed signal light in the C-band is changed from full channels to two channels.

In this case, for example, information about the change of specific system operating conditions as shown in (e)–(g) below is transmitted from the system administrating section 18 to the pumping light administrating section 19 (Step 1 in FIG. 2):
(e) a wavelength configuration of the signal light after the change: two channels consisting of 1527 nm (shortest wavelength) and 1561 nm (longest wavelength);
(f) optical power per one channel after the change: 8 dBm/ch; and
(g) changing method: reduce the number of the signal light from the short wavelength side on a one-by-one channel basis every "t"seconds after the addition starting time $T_0$.

In response to such system operating information, the pumping light administrating section 19, based on the information as shown in the above (e)–(f) and by utilizing a database and the like, calculates the optimal supply conditions of the pumping light P at the time of the two-channel operation as shown below (Step 2 in FIG. 2):
the number of the wavelength of the pumping light: 2;
the wavelength of each pumping light: 1425 nm and 1460 nm; and
the power of each pumping light supplied to the optical transmission path: 20 dBm and 19.5 dBm.

When the target value of the wavelength and power of the pumping light P as described above are calculated, the pumping light administrating section 19 first judges the changing method from the wavelength setting of the pumping light P corresponding to the full-channel operation to the wavelength setting of the pumping light P corresponding to the two-channel operation, and then determines the changing procedure of the pumping light P in consideration of the maintenance of the transmission quality (Step 3 in FIG. 2).

Here, assuming that the wavelength of the pumping light at the time of the full-channel operation is set to three wavelengths consisting of 1427 nm, 1440 nm and 1458 nm, for example, the changing method is preferable to shift the wavelength of each pumping light corresponding to 1427 nm and 1458 nm having a small difference from each pumping light wavelength at the time of the two-channel operation calculated in Step 2, and to stop the supply of the pumping light corresponding to 1440 nm having a large difference from the pumping light wavelength at the time of the two-channel operation. Further, it is to be noted that the changing procedure is determined in accordance with priority set based on the information shown in (g) above. In Table 2 below, an example of the wavelength setting changing method and priority of the pumping light P before and after the change is shown.

TABLE 2

| wavelength of pumping light before change | method for changing to pumping light wavelength after the change | Priority |
|---|---|---|
| 1427 nm ($\lambda_1$) | wavelength shift from 1427 nm ($\lambda_1$) to 1425 nm ($\lambda_1'$) | (2) |
| 1440 nm ($\lambda_2$) | stop supply of pumping light of 1440 nm ($\lambda_2$) | (1) |
| 1458 nm ($\lambda_3$) | wavelength shift from 1458 nm ($\lambda_3$) to 1460 nm ($\lambda_3'$) | (3) |

When the changing procedure of the pumping light P is determined as shown in Table 2, in accordance with the changing procedure, the wavelength variable pumping light generating section 11 and the pumping light multiplexing section 12 are controlled in compliance with the changing method shown in (g) above and in synchronization with time until the wavelength and power of the pumping light P achieve the target value calculated in Step 2 (Step 4 in FIG. 2).

Figure 4:
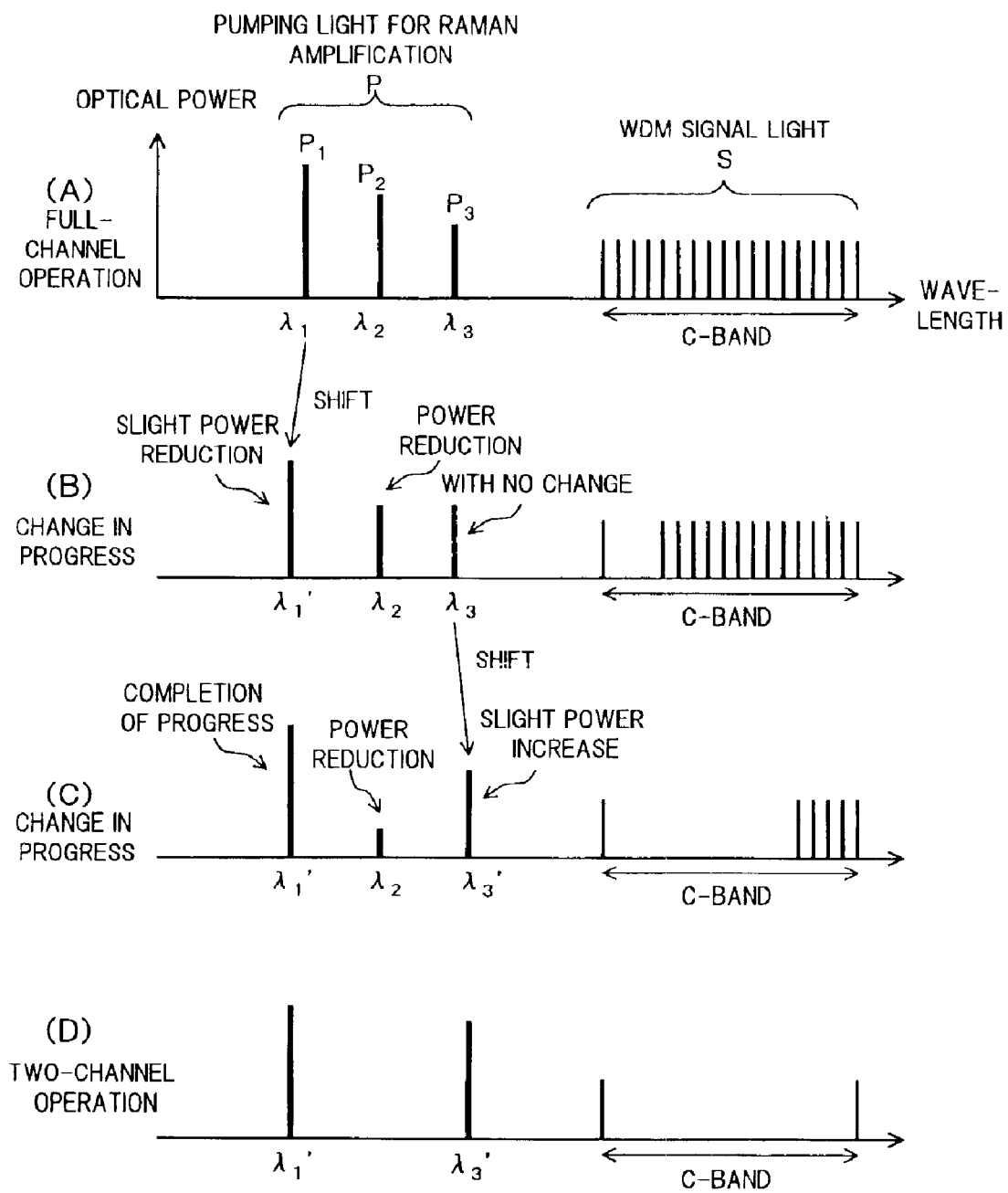
FIG. 4 is a diagram for explaining controlling operation when a full channel operation is changed into two channel operation in the Raman amplifier according to the present invention.

FIG. 4 is a diagram for explaining a series of controlling operations in Step 4.

At the time of the full-channel operation, as shown in (A) of FIG. 4, the pumping light $P_1$, $P_2$ and $P_3$ having wavelengths $\lambda_1$, $\lambda_2$ and $\lambda_3$ corresponding to the WDM signal light S in the C-band are supplied to the optical transmission path 1 and the full-channel signal light included in the WDM signal light S is Raman amplified.

Then, as the time $T_0$ to start the change of the operational conditions from the full-channel operation to the two-channel operation has elapsed and the signal light in the C-band is reduced from the short wavelength side in sequence, in a stage where the change is in progress as shown in (B) of FIG. 4, for example, in response to the reduction of the number of the signal light in the C-band, the power of the pumping light $P_2$ is reduced and, on the other hand, the wavelength of the pumping light $P_1$ is shifted from $\lambda_1$ (1427 nm) toward $\lambda_1'$ (1425 nm) with slight reduction of the power. Here, it is assumed that there is no change in the wavelength and power of the pumping light $P_3$.

Then, as the signal light is further reduced, when the signal light is arranged at the shortest wavelength side and the longest wavelength side in the C-band as shown in (C) of FIG. 4, the power of the pumping light $P_2$ is further reduced and, on the other hand, the wavelength of the pumping light $P_3$ is shifted from $\lambda_3$ (1458 nm) to $\lambda_3'$ (1460 nm) with slight increase of the power. Here, it is assumed that the wavelength shift and power adjustment for the pumping light $P_1$ have been completed at this time.

Then, when the signal light in the C-band is reduced to only two channels of 1527 nm and 1561 nm, as shown in (D) of FIG. 4, the supply of the pumping light $P_2$ is stopped and, on the other hand, the wavelength and power of each pumping light $P_1$ and $P_2$ are controlled to be the target value calculated in Step 2.

Here, the actual supply conditions of each pumping light $P_1$ and $P_3$ are monitored by the pumping light monitor section 15 and, according to the monitoring result, the feedback control of the wavelength variable pumping light generating section 11 and the pumping light multiplexing section 12 is performed. Further, at the same time, the conditions of the WDM signal light S actually Raman amplified are monitored by the signal light monitor section 17, and according to the monitoring result, the supply conditions of each pumping light $P_1$ and $P_3$ are finely adjusted so that the transmission quality can be kept in good (Step 5 in FIG. 2).

As described above, in the Raman amplifier 10, when the system operating conditions is changed from the full-channel operation of the C-band to the two-channel operation, since the supply conditions of the pumping light P is optimized according to the change with time of the operating conditions, it is possible to change the operational channels reliably without affecting the service in operation. Further, since the wavelength of each pumping light can be optimized corresponding to the change of the operational conditions, the power consumption can be reduced.

Figure 5:
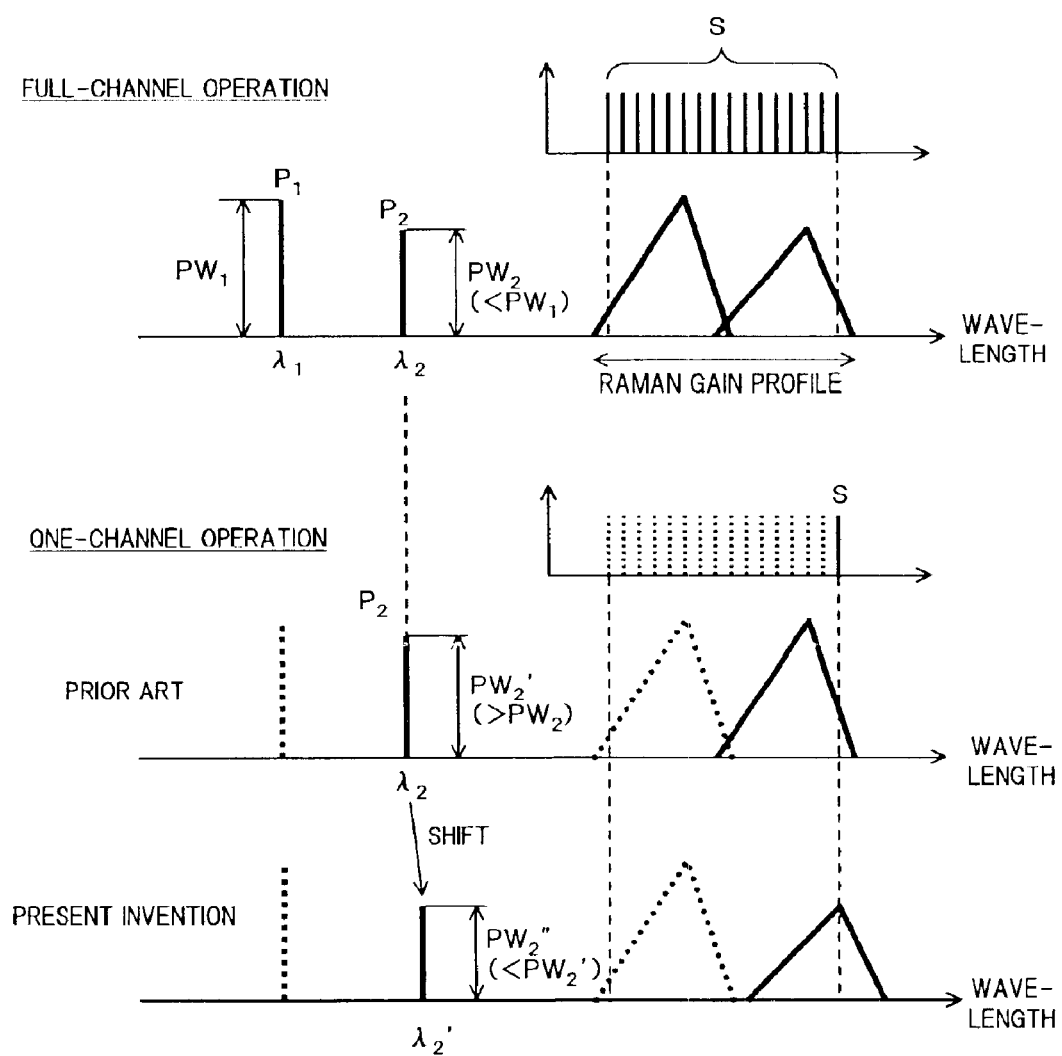
FIG. 5 is a conceptual view for explaining how to reduce power consumption (or improve efficiency) in the Raman amplifier according to the present invention.

An effect of the Raman amplifier 10 to reduce the power consumption can be explained specifically using the conceptual view in FIG. 5. Here, for clarity of explanation, a case where a state is changed from the full-channel operation in which the signal light is Raman amplified by two pumping light $P_1$ and $P_2$ to the one-channel operation will be considered. As shown in the upper part of FIG. 5, at the time of the full-channel operation, in order to compensate for output degradation at the short wavelength side due to Raman effect between signal light, the power $PW_1$ of the pumping light $P_1$ at the short wavelength side must be larger than the power $PW_2$ of the pumping light $P_2$ at the long wavelength side ($PW_1 > PW_2$). When such full-channel operation is changed into the one-channel operation using the longest wavelength as shown in the lower part of FIG. 5, in the conventional method in which the wavelength of the pumping light $P_2$ is fixed, in response to extinction of the signal light at the short wavelength side, the power $PW_2'$ of the pumping light $P_2$ must become larger than the power $PW_2$ at the time of the full-channel operation ($PW_2' > PW_2$). In such supply conditions of the pumping light $P_2$, the power of the pumping light is consumed uselessly since the peak wavelength of Raman gain deviates from the wavelength of the signal light. On the other hand, according to the present invention, the pumping light $P_2$ having optimal wavelength is supplied to the one-channel signal light S by shifting the wavelength of the pumping light $P_2$ from $\lambda_2$ to $\lambda_2'$ according to the change of the operating conditions. Thereby, it becomes possible to efficiently use the pumping light power, since the peak wavelength of Raman gain becomes substantially same as the wavelength of the signal light. Therefore, since the power $PW_2'$ of the pumping light $P_2$ can be set to a smaller value than the power $PW_2'$ in the conventional technique, the consumption power of the Raman amplifier can be reduced.

Here, although the case in which the number of the signal light in the same band is reduced has been discussed in the second specific example, the present invention is not limited to this, and it can also be applied to a case in which at least one of plural bands in operation is reduced, similarly to the above case basically.

Further, although the backward pumping configuration in which the pumping light P is propagated in the direction opposite to the signal light S has been shown in the basic configuration of the Raman amplifier 10, the present invention is not limited to this and can also be applied to a forward pumping configuration in which the pumping light P is propagated in the same direction as the signal light S, or a bi-directional configuration.

Still further, although each pumping light $P_1$–$P_N$ output from the wavelength variable pumping light generating section 11 is wavelength division multiplexed using the pumping light multiplexing section 12 that has wavelength variable transmission characteristics, if the wavelength variable band of each pumping light $P_1$–$P_N$ is relatively narrow, the pumping light multiplexing section having fixed transmission wavelength characteristics may alternatively be used.

In addition, although the actually supplied pumping light P is monitored for feedback control and at the same time, the supply conditions of the pumping light are finely adjusted by monitoring the Raman amplified signal light S, such functions for such feedback control and fine adjustment may be provided appropriately in response to control accuracy required for optimization of the supply conditions of the pumping light, or may even be omitted in response to control accuracy.

Next, an exemplary specific configuration of the wavelength variable pumping light generating section 11 and the pumping light multiplexing section 12 in the Raman amplifier 10 will be described.

The wavelength variable pumping light generating section 11 to be applied to the Raman amplifier 10 is required to variably control individually and also simultaneously each of the wavelength and power of a plurality of pumping light $P_1$–$P_N$. Moreover, it is preferable that the variable control of each pumping light $P_1$–$P_N$ is performed successively. Specific forms of such wavelength variable pumping light generating section 11 may include, for example, a semiconductor laser-based wavelength variable light source, a fiber laser-based wavelength variable light source and the like. Such wavelength variable light sources are basically comprised of an amplification medium and a wavelength selecting device, wherein the wavelength of the output light is typically controlled arbitrarily by changing properties of the wavelength selecting device so that resonance occurs at a desired frequency, and the power of the output light is typically controlled arbitrarily by means of power adjustment of the amplification medium. A semiconductor laser, a fiber laser and the like may be used for the amplification medium mentioned above, for example. On the other hand, diffraction gratings or a band-pass filter, an acousto-optic tunable filter (AOTF) and the like may be used for the wavelength selecting device mentioned above, for example. Hereinafter, specific examples of well-known wavelength variable light sources applicable as the wavelength variable pumping light generating section 11 will be listed. However, it is to be noted that the wavelength variable pumping light generating section according to the present invention is not limited to following specific examples.

As one specific example of the semiconductor laser-based wavelength variable light source, there is a configuration in which the wavelength of the output light can be varied by controlling a chip temperature of the semiconductor laser. Further, as another specific example, there is a configuration in which an external resonator that utilizes fiber Bragg gratings (FBGs) for stabilizing the oscillated wavelength is provided at the output side of the semiconductor laser and the wavelength of the output light can be varied by controlling a temperature of the FBGs or by applying stress to the FBGs.

Figure 6:
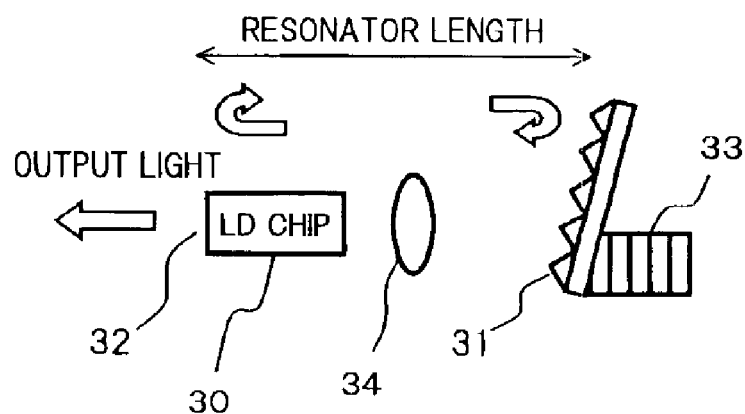
FIG. 6 is a diagram showing an exemplary configuration of a semiconductor laser-based wavelength variable light source used in a wavelength variable pumping light generating section constituting the Raman amplifier according to the present invention.

As a further specific example, as shown in FIG. 6, there is a configuration having a semiconductor laser 30 and a wavelength selecting device 31 using diffraction gratings consisting of gratings and the like or a band-pass filter consisting of a dielectric multi-layer film filter and the like, wherein the wavelength of the output light can be varied by adjusting a resonator length with high reflecting section 32 using a mirror and the like and by adjusting an angle and temperature of the wavelength selecting device 31. Here, in the exemplary configuration of FIG. 6, the resonator length is adjusted by a voltage control of a piezoelectric device 33 and the angle of the wavelength selecting device 31 is adjusted by a motor (not shown) and the like. A reference numeral 34 denotes a lens.

As a specific example of a fiber laser-based wavelength variable light source, there is a configuration in which light of a desired wavelength is output by shifting the wavelength by means of a higher order Raman shift caused by a cascaded Raman resonator 35 with fiber Bragg gratings (FBGs) or reflection films at both ends thereof, wherein the wavelength of the output light can be varied by controlling temperature or applying stress of the FBGs located at the output side of the cascaded Raman resonator 35 or by adjusting an angle of the band-pass filter or a birefringent plate in the cascaded Raman resonator 35. Such a wavelength variable light source is well known in an article such as: M. D. Mermelstein, et al., "A High-Efficiency Power-Stable Three-Wavelength Configurable Raman Fiber Laser", OFC2000 PD3.

As a further specific example, there is a ring configured erbium fiber laser in which wavelength selecting devices such as a band-pass filter and the like are cascaded to an optical path wherein the wavelength of the output light can be varied by adjusting an angle and temperature of the wavelength selecting devices. As a still further example, there is a configuration in which the wavelength of the output light can be varied by providing a tunable optical filter at the output side of a broadband light source such as a white-light laser. Such a wavelength variable light source is effective for reducing the number of the pumping light sources, since pumping light of a wider wavelength band becomes possible to be supported by a single light source.

Specific examples of the pumping light multiplexing section 12 to be applied to the Raman amplifier 10 may include an optical circulator, a Mach-Zehnder interferometer type waveguide, an interleaver, a film filter, a fused coupler and the like.

Figure 8:
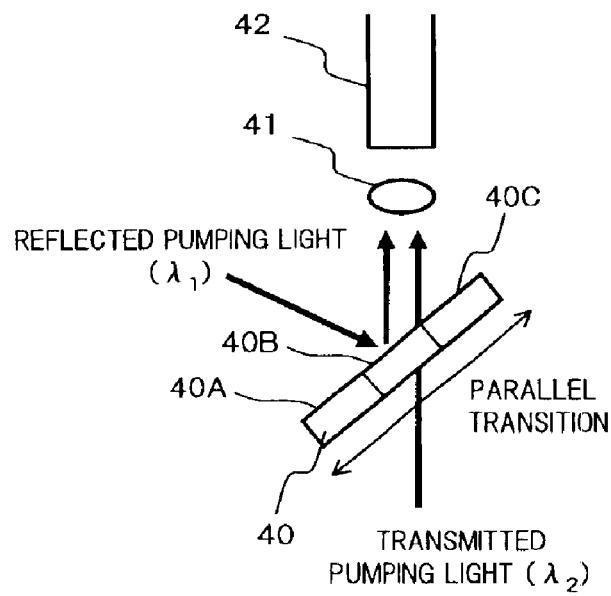
FIG. 8 is a diagram showing a specific example of a configuration of a pumping light multiplexing section constituting the Raman amplifier according to the present invention.
Figure 9:
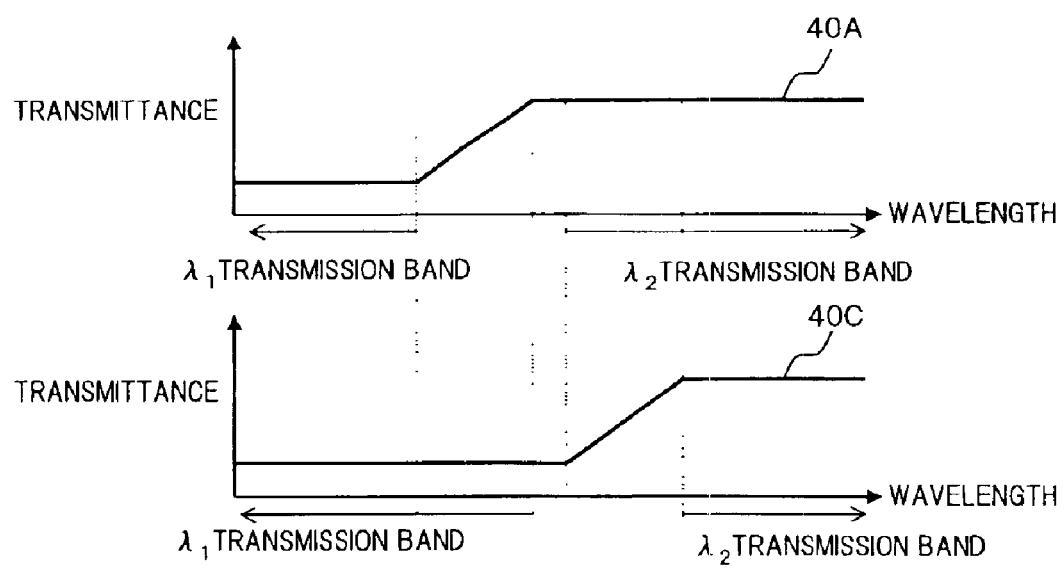
FIG. 9 is a diagram for explaining wavelength transmission characteristics of a film filter in the configuration shown in FIG. 8.

Further, as shown in FIG. 8, for example, it is possible to adopt a configuration in which a film filter 40 is used as a wavelength selecting device, wherein wavelength transmission characteristics can be varied by controlling mechanical movement of the position of the film filter 40 according to the change of the wavelength of pumping light. The film filter 40 which includes ranges 40A–40C capable of changing the wavelength transmission characteristics can multiplex the pumping light having wavelengths $\lambda_1$ and $\lambda_2$ with low loss by setting each of the ranges 40A and 40C to have wavelength transmission characteristics as shown in FIG. 9. The pumping light multiplexed by the film filter 40 is incident into an optical fiber 42 via a condenser lens 41. Here, in the configuration as described above, it is required that the position of the film is moved slidably by parallel translation with respect to the incident light and the coupling position of the multiplexed pumping light is not affected by the movement of the film.

Here, an example of a preferable configuration in which each of the specific examples of the wavelength variable pumping light generating section 11 and the pumping light multiplexing section 12 as described above is combined will be described as follows.

Figure 10:
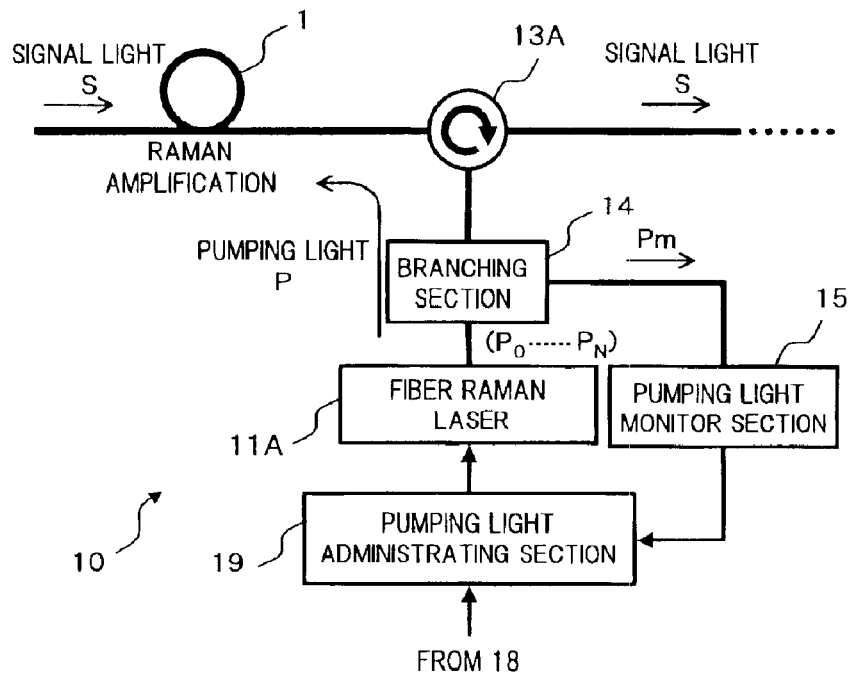
FIG. 10 is a schematic block diagram showing a specific example of the Raman amplifier according to the present invention that uses a multi-wavelength fiber Raman laser with a wavelength variable function.

FIG. 10 is a schematic block diagram showing an example that uses a multi-wavelength fiber Raman laser with a wavelength variable function as the wavelength variable pumping light generating section 11.

Figure 7:
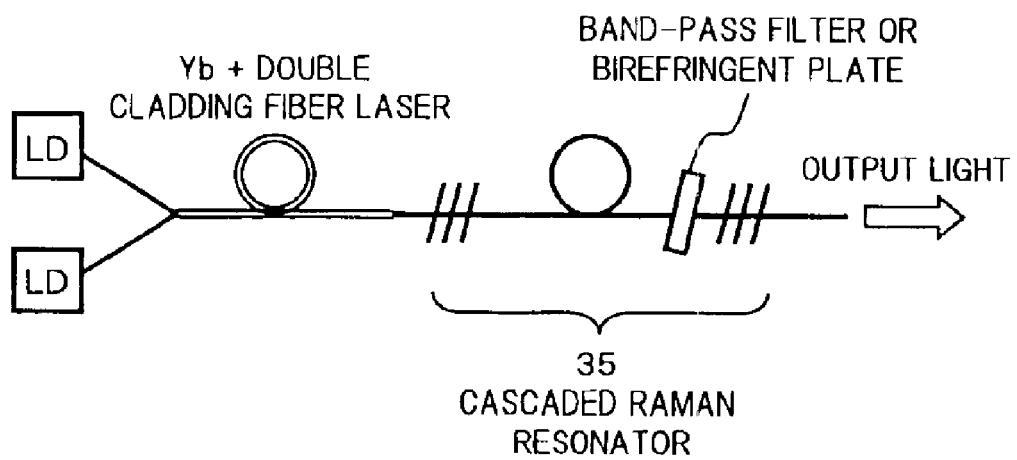
FIG. 7 is a diagram showing an exemplary configuration of a fiber laser-based wavelength variable light source used in the wavelength variable pumping light generating section constituting the Raman amplifier according to the present invention.

In FIG. 10, the multi-wavelength fiber Raman laser with a wavelength variable function 10A corresponds to the specific example shown in FIG. 7, wherein pumping light including a plurality of wavelength light $P_1$–$P_N$ is output from a single fiber Raman laser. Therefore, the multi-wavelength fiber Raman laser with a wavelength variable function 10A also has a function as the pumping light multiplexing section 12. The pumping light output from this fiber Raman laser 10A is supplied to the optical transmission path 1 via an optical circulator 13A as the pumping light supplying section 13, and also a part thereof is branched by the branching section 14 to be sent to the pumping light monitor section 15 as monitoring pumping light Pm. Thus, by using the multi-wavelength fiber Raman laser with a wavelength variable function 10A as the wavelength variable pumping light generating section 11 and the pumping light multiplexing section 12, the configuration of the Raman amplifier 10 can be simplified.

Figure 11:
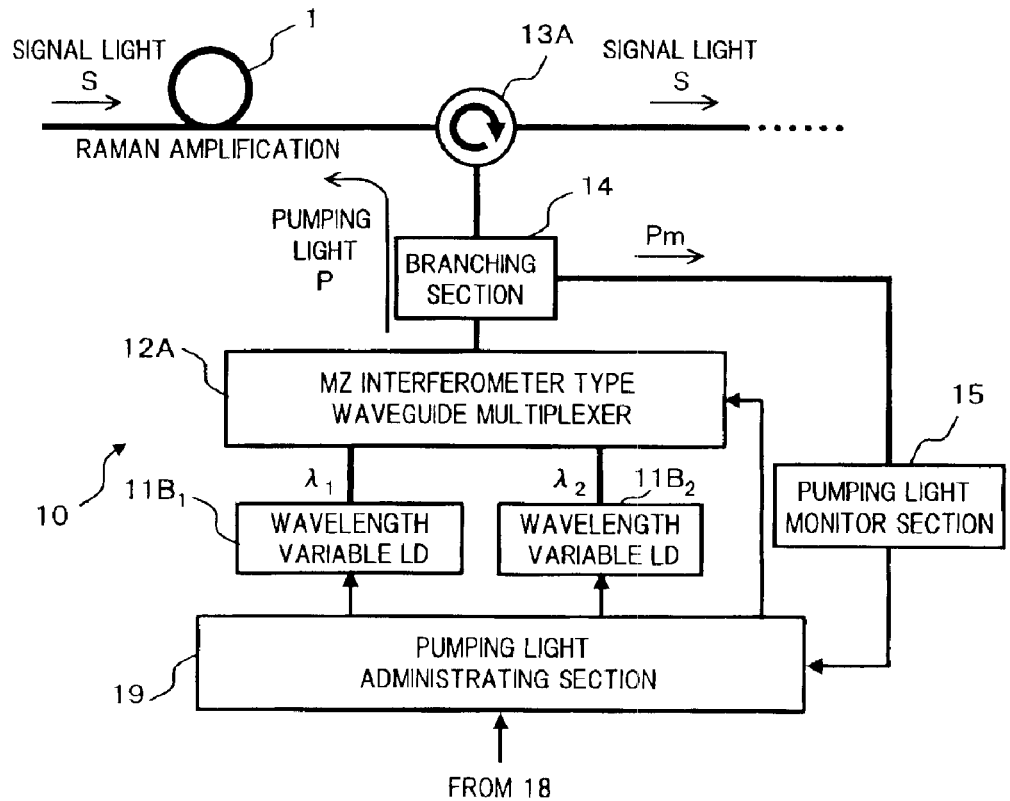
FIG. 11 is a schematic block diagram showing a specific example of the Raman amplifier according to the present invention that uses a semiconductor laser-based wavelength variable light source and a Mach-Zehnder interferometer type waveguide multiplexer.

FIG. 11 is a schematic block diagram showing an example that uses a semiconductor laser-based wavelength variable light source as the wavelength variable pumping light generating section 11 and a Mach-Zehnder interferometer type waveguide multiplexer as the pumping light multiplexing section 12.

Figure 12:
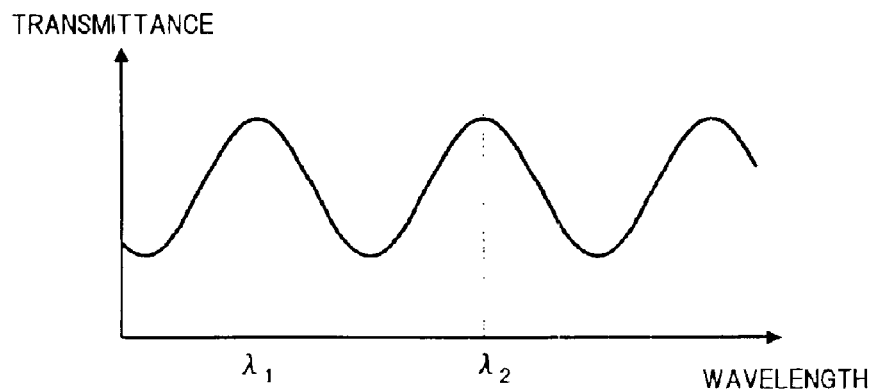
FIG. 12 is a diagram for explaining wavelength transmission characteristics of the Mach-Zehnder interferometer type waveguide multiplexer in the specific example shown in FIG. 11.

In the configuration of FIG. 11, for example, each pumping light output from two wavelength variable light sources $11B_1$ and $11B_2$ is wavelength division multiplexed by a Mach-Zehnder (MZ) interferometer type waveguide multiplexer 12A with wavelength variable transmission characteristics and then supplied to the optical waveguide 1 via the branching section 14 and the optical circulator 13A. More specifically, when each pumping light having wavelengths $\lambda_1$ and $\lambda_2$ is output from the wavelength variable light sources $11B_1$ and $11B_2$, the MZ interferometer type waveguide multiplexer 12A exhibits wavelength transmission characteristics as shown in FIG. 12, and when the wavelength of each of the wavelength variable light sources $11B_1$ and $11B_2$ is changed by the pumping light administrating section 19, the wavelength transmission characteristics of the MZ interferometer type waveguide multiplexer 12A are also controlled by means of a temperature control and the like simultaneously.

Here, although a configuration in which two wavelength variable light sources $11B_1$ and $11B_2$ are used has been shown, it is possible to combine three or more wavelength variable light sources alternatively.

Figure 13:
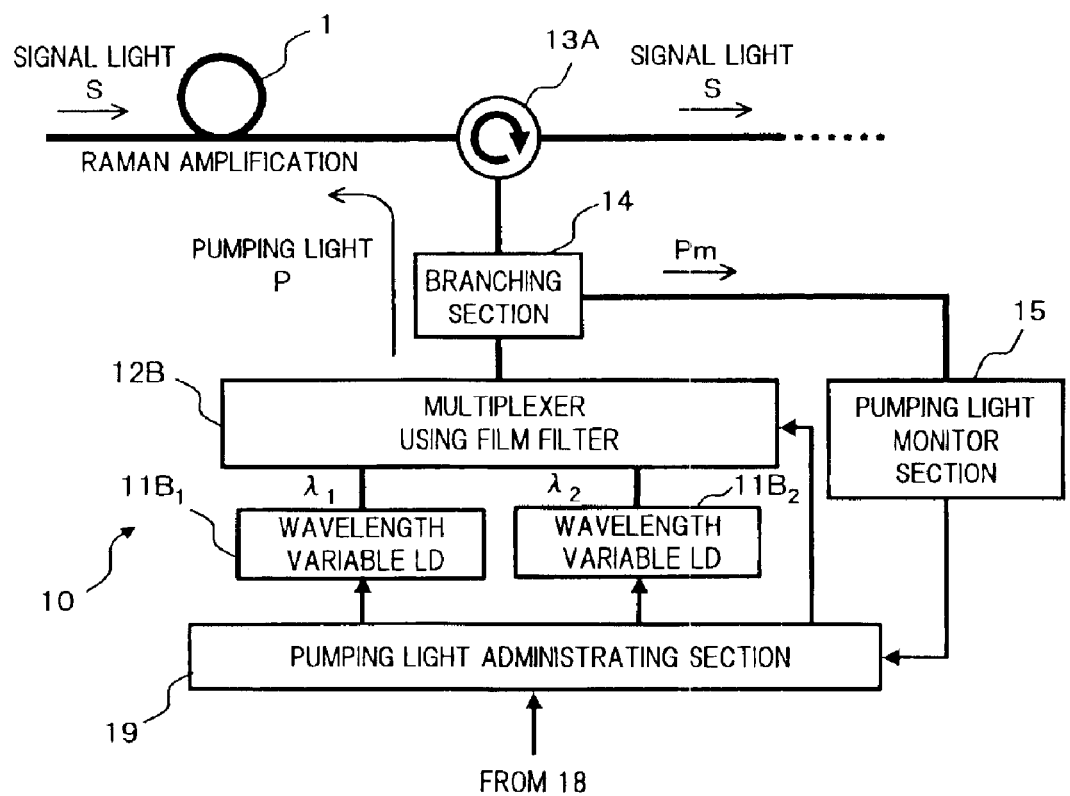
FIG. 13 is a schematic block diagram showing a variation of the configuration shown in FIG. 11.

FIG. 13 is a schematic block diagram showing a variation of the configuration shown in FIG. 11.

In the configuration of FIG. 13, instead of the MZ interferometer type waveguide multiplexer 12A in the configuration of FIG. 11, a multiplexer 12B using the film filter shown in FIG. 8 is used. In such a variation, variable wavelength transmission characteristics of the multiplexer 12B is controlled such as by mechanically changing the arrangement of parts in the multiplexer 12B.

Figure 14:
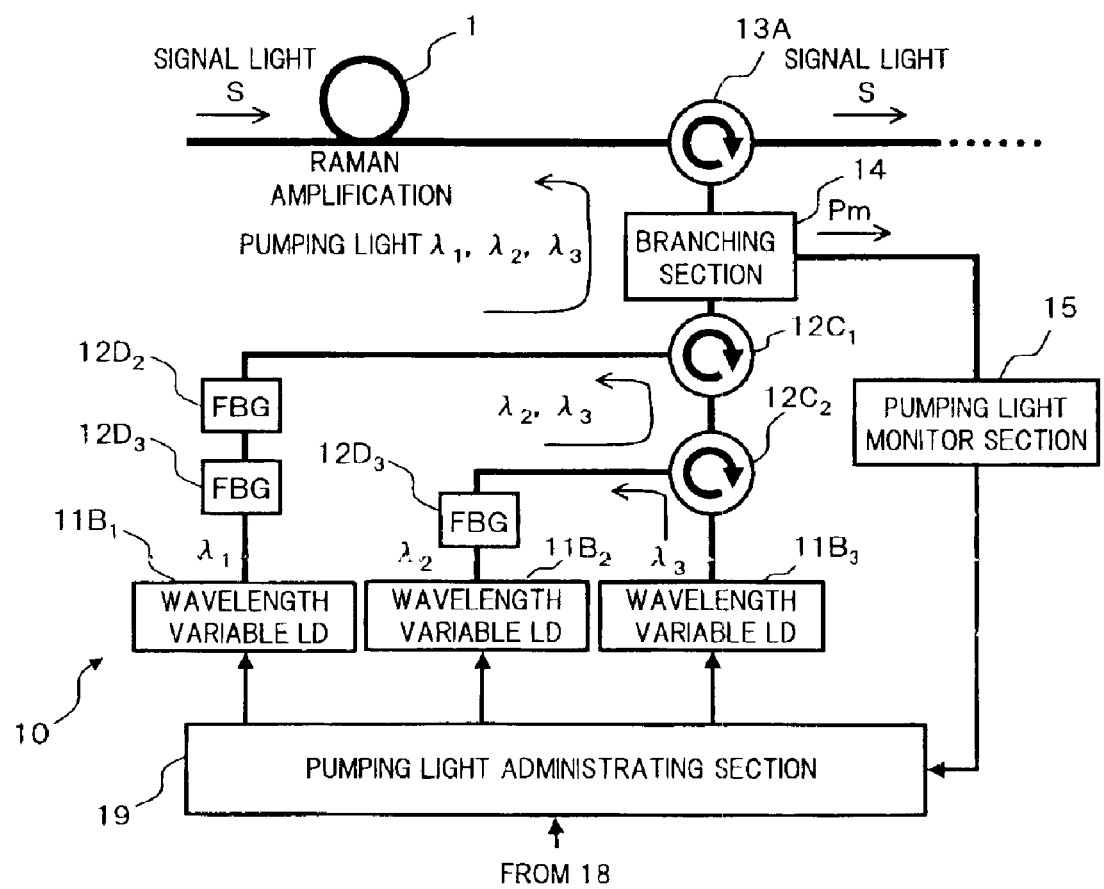
FIG. 14 is a schematic block diagram showing another variation of the configuration shown in FIG. 11.

FIG. 14 is a schematic block diagram showing another variation of the configuration shown in FIG. 11.

In the configuration of FIG. 14, for example, three semiconductor laser-based wavelength variable light sources $11B_1$–$11B_3$ are used as the wavelength variable pumping light generating section 11, and the pumping light output from each wavelength variable light source $11B_1$–$11B_3$ is multiplexed by two optical circulators $12C_1$ and $12C_2$, and three fiber Bragg gratings (FBGs) $12D_2$, $12D_3$ and $12D_3$, to be supplied to the optical waveguide 1 via the branching section 14 and the optical circulator 13A. More specifically, the light having a wavelength $\lambda_3$ output from the wavelength variable light source $11B_3$ passes through the optical circulator $12C_2$, is reflected by the FBGs $12D_3$ inserted into the optical path between the wavelength light source $11B_2$ and the optical circulator $12C_2$ for reflecting the light having a wavelength $\lambda_3$, and then sent to the optical circulator $12C_1$ through the optical circulator $12C_2$ together with the light having a wavelength $\lambda_2$ output from the wavelength light source $11B_2$. Then, each light having wavelengths $\lambda_2$ and $\lambda_3$ that has passed through the optical circulator $12C_1$ is reflected by the FBGs $12D_2$ for reflecting the light having the wavelength $\lambda_2$ and the FBGs $12D_3$ for reflecting the light having the wavelength $\lambda_3$, both of the FBGs being inserted into the optical path between the wavelength variable light source $11B_2$ and the optical circulator $12C_1$, respectively, and then sent to the branching section 14 through the optical circulator $12C_1$ together with the light having a wavelength $\lambda_1$ output from the wavelength variable light source $11B_1$. In this manner, the pumping light including light having each wavelength $\lambda_1$–$\lambda_3$ multiplexed is supplied to the optical transmission path 1 via the optical circulator 13A. In such a configuration, in response to the change of the output wavelengths of each wavelength variable light sources $11B_2$ and $11B_3$, each reflection wavelength can be adjusted by controlling temperature of the FBGs $12D_2$ and $12D_3$ or applying stress to them.

Figure 15:
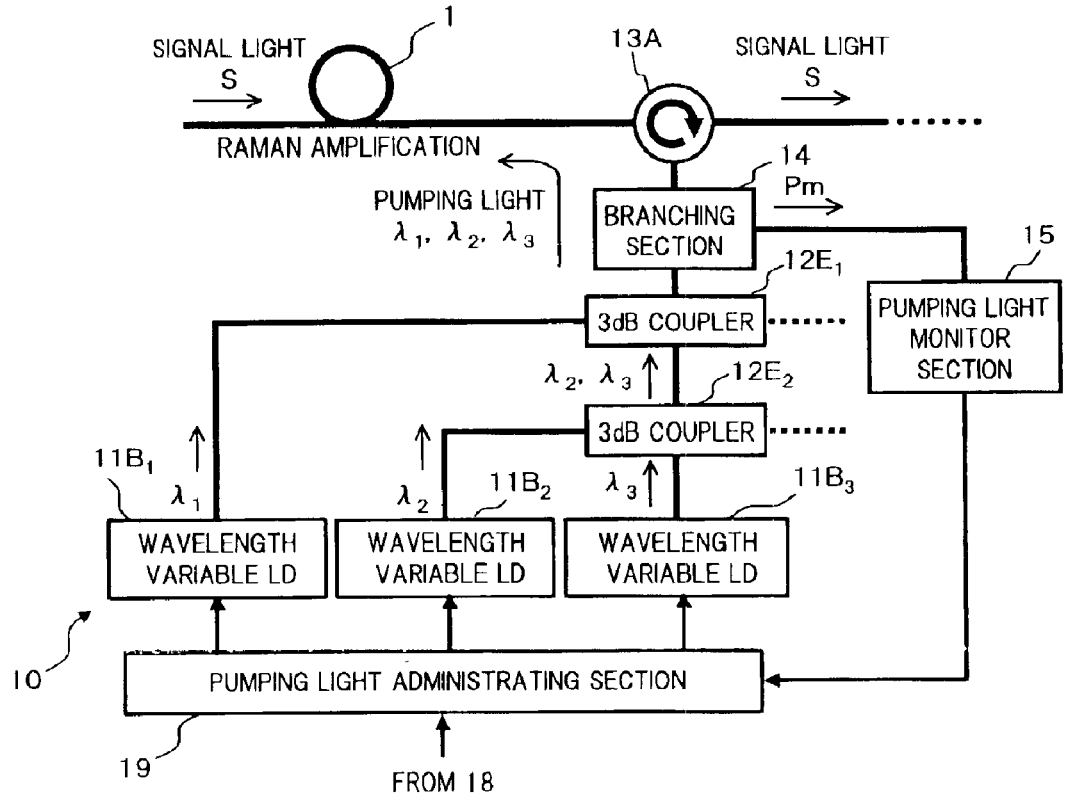
FIG. 15 is a schematic block diagram showing a variation of the configuration shown in FIG. 14.

FIG. 15 is a schematic block diagram showing a variation of the configuration shown in FIG. 14.

In the configuration of FIG. 15, instead of the optical circulators $12C_1$ and $12C_2$ and FBGs $12D_2$ and $12D_3$ in the configuration of FIG. 14, two 3 dB couplers $12E_1$ and $12E_2$ are connected in a multistage manner, and each light having wavelengths $\lambda_1$–$\lambda_3$ output from each wavelength variable light source $11B_1$–$11B_3$ are multiplexed. In such a variation, although the power of the pumping light is reduced by one-half every time it passes through each of the 3 dB couplers $12E_1$ and $12E_2$, sufficient power of the pumping light can be supplied to the optical transmission path 1 if each of wavelength variable light source $11B_1$–$11B_3$ has sufficiently surplus output power. On the other hand, the pumping light output from each 3 dB coupler but not sent to the optical circulator 13A side (the pumping light output from the ports indicated by dotted lines in FIG. 15) may be utilized for Raman amplification in other parts.

Figure 16:
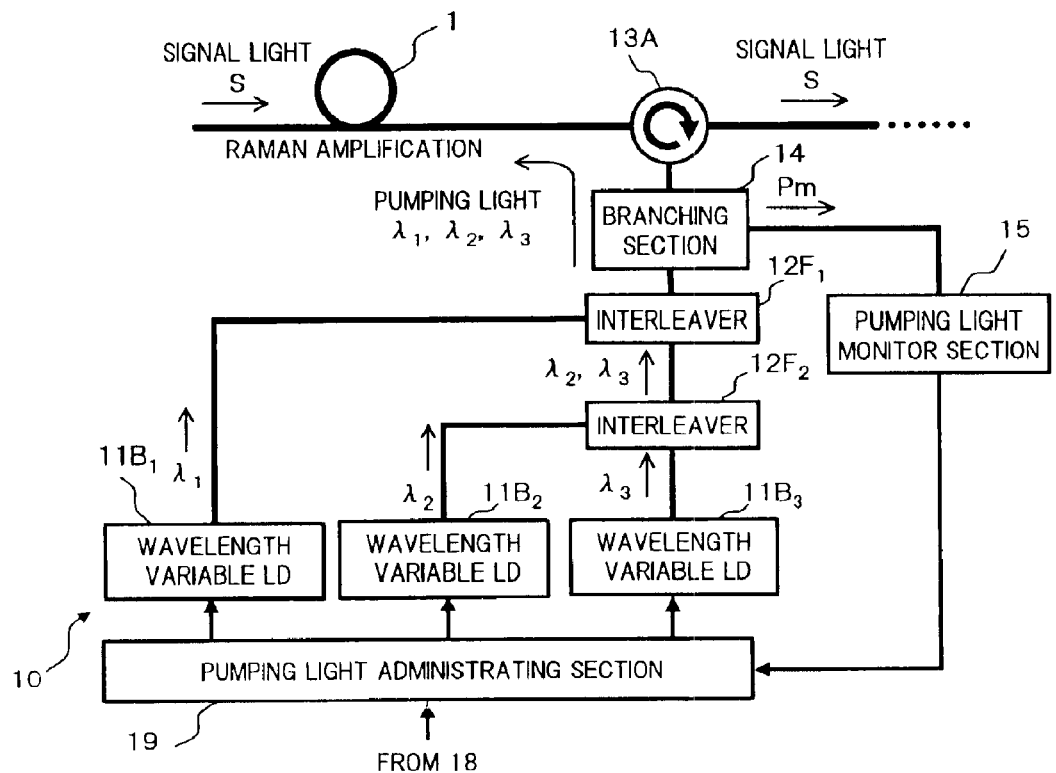
FIG. 16 is a schematic block diagram showing another variation of the configuration shown in FIG. 14.

FIG. 16 is a schematic block diagram showing another variation of the configuration shown in FIG. 14.

In the configuration of FIG. 16, instead of the optical circulators $12C_1$ and $12C_2$ and FBGs $12D_2$ and $12D_3$ in the configuration of FIG. 14, two interleavers $12F_1$ and $12F_2$ are connected in a multistage manner, and each light having wavelengths $\lambda_1$–$\lambda_3$ output from each wavelength variable light source $11B_1$–$11B_3$ are multiplexed. The interleaver $12F_2$ to which each output light from the wavelength variable light sources $11B_2$ and $11B_3$ are input is configured so that the cycle in its wavelength transmission range is set to $T_2$, while the interleaver $12F_1$ to which the output light from the interleaver $12F_2$ and the output light from the wavelength variable light source $11B_1$ are input is configured so that the cycle in its wavelength transmission range is set to $T_1$ that is longer than that in the interleaver $12E_2$ ($T_1 > T_2$). By using such known interleavers $12F_1$ and $12F_2$, the pumping light of each wavelength $\lambda_1$–$\lambda_3$ can be multiplexed with low loss, to be supplied to the optical transmission path 1 via the optical circulator 13A.

Here, it is to be noted that each specific configuration of the wavelength variable pumping light generating section 11 and the pumping light multiplexing section 12 has been described above for illustrative purpose only and the present invention is not limited to these examples.

Figure 17:
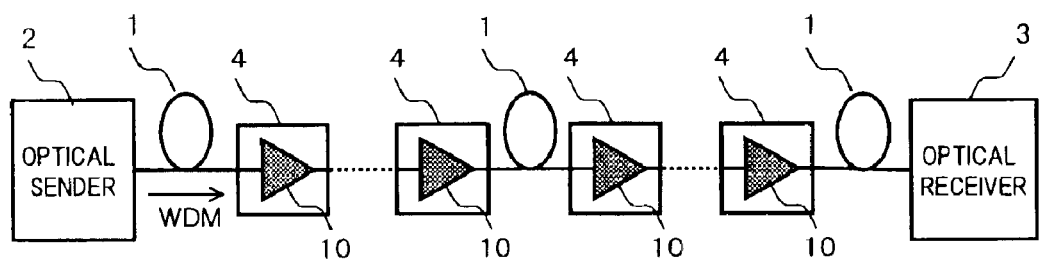
FIG. 17 is a diagram showing an example of a WDM optical communication system to which the Raman amplifier according to the present invention is applied.

The Raman amplifier of the present invention as described above can be applied to various types of WDM optical communication systems that Raman amplify and transmit WDM signal light on an optical transmission path. FIG. 17 shows an example of the WDM optical communication system to which the Raman amplifier according to the present invention is applied. The WDM optical communication system in FIG. 17 comprises an optical sender station 2, an optical receiver station 3, an optical transmission path 1 connecting between the sender station and receiver station, and a plurality of optical repeater stations 4 arranged along the optical transmission path 1 at required intervals, wherein the Raman amplifier 10 of the present invention is used as an optical amplifier in each optical repeater station 4. Further, the Raman amplifier 10 of the present invention can also be applied to a postamplifier to be provided in the optical sender station 2 and a preamplifier to be provided in the optical receiver station 3 and the like, although these elements are not shown herein. For applying to such a WDM optical communication system, the Raman amplifier 10 of either a distributed parameter type or a concentrated type may be appropriately selected as needed.

What is claimed are:

1. A Raman amplifier for supplying pumping light to an amplification medium on an optical transmission path through which signal light is propagated and Raman amplifying the signal light being propagated through said amplification medium, comprising:

a pumping light supplying unit that generates a plurality of pumping light capable of changing at least one of a wavelength and power thereof, and multiplexes said plurality of pumping light to supply the multiplexed pumping light to said amplification medium; and a pumping light controlling unit that controls supply conditions of the pumping light by said pumping light supplying unit in synchronization with a change with time of operating conditions based on information indicating the operating conditions with regard to transmission of signal light.

2. A Raman amplifier according to claim 1, wherein said pumping light supplying unit comprises a pumping light generating section that generates a plurality of pumping light with at least one of the wavelength and power of the plurality of pumping light controlled in response to a controlling signal output from said pumping light controlling unit, a pumping light multiplexing section that multiplexes the plurality of pumping light output from said pumping light generating section, and a pumping light supplying section that supplies the pumping light multiplexed by said pumping light multiplexing section to said amplification medium.

3. A Raman amplifier according to claim 2, wherein said pumping light multiplexing section can change wavelength transmission characteristics and said wavelength transmission characteristics are controlled in response to the controlling signal output from said pumping light controlling unit.

4. A Raman amplifier according to claim 1, wherein said pumping light controlling unit calculates a target value of the supply conditions of pumping light after the change of the operating conditions based on said information indicating the operating conditions with regard to the transmission of said signal light, and sets priority of the control to said plurality of pumping light corresponding to the change with time of the operating conditions, and then, in accordance with a changing procedure determined according to said priority, controls said pumping light supplying unit so that the supply conditions of pumping light approaches said target value in synchronization with the change with time of the operating conditions.

5. A Raman amplifier according to claim 4, wherein, when the wavelength of pumping light before the change of the operating conditions coincides with or approaches the wavelength of the signal light after the change of the operating conditions, said pumping light controlling unit sets control priority to the pumping light to be higher than other pumping light.

6. A Raman amplifier according to claim 4, wherein said pumping light controlling unit sets priority to the control to particular pumping light responsible for Raman amplification for a wavelength band of particular signal light that is in the course of the change of the operating conditions to be higher than other pumping light.

7. A Raman amplifier according to claim 4, wherein said pumping light controlling unit comprises a system administrating section that generates system operating information that includes information indicating the operating conditions about the transmission of said signal light and information about the change with time of said operating conditions based on a supervisory signal transmitted with the signal light, and a pumping light administrating section that calculates said target value and also determines the changing procedure according to said priority based on the system operating information transmitted from said system administrating section, and then controls said pumping light supplying unit so that the supply conditions of the pumping light approaches said target value in accordance with said changing procedure and in synchronization with the change with time of the operating conditions.

8. A Raman amplifier according to claim 1, further comprising;
a pumping light monitoring unit that monitors supply conditions of the pumping light provided to the amplification medium by said pumping light supplying unit,
wherein said pumping light controlling unit performs a feedback control of said pumping light supplying unit in response to a monitoring result of said pumping light monitoring unit.

9. A Raman amplifier according to claim 1, further comprising;
a signal light monitoring unit that monitors output conditions of the signal light propagated through said amplification medium and Raman amplified,
wherein said pumping light controlling unit finely adjusts the supply conditions of the pumping light by said pumping light supplying unit in response to a monitoring result of said signal light monitoring unit.

10. A wavelength division multiplex optical communication system for Raman amplifying and transmitting wavelength division multiplexed signal light including a plurality of channel light having different wavelengths, comprising
a Raman amplifier recited in claim 1.

11. A controlling method for when pumping light is supplied to an amplification medium on an optical transmission path through which signal light is propagated and the signal light being propagated through said amplification medium is Raman amplified, wherein:
in a condition where a plurality of pumping light capable of changing at least one of a wavelength and power thereof are generated, and said plurality of pumping light are multiplied to be supplied to said amplification medium,
said condition of supplying the pumping light is controlled in synchronization with a change with time of operating conditions based on information indicating the operating conditions with regard to transmission of signal light.

* * * * *